United States Patent

Fukamichi et al.

[11] Patent Number: 6,055,135
[45] Date of Patent: *Apr. 25, 2000

[54] EXCHANGE COUPLING THIN FILM AND MAGNETORESISTIVE ELEMENT COMPRISING THE SAME

[75] Inventors: Kazuaki Fukamichi, 33-26 Jiyugaoka, Yamada, Taihaku-ku, Sendai-shi, Miyagi-ken; Yutaka Shimada, Miyagi-ken; Osamu Kitakami, Miyagi-ken; Kim Jek Jun, Miyagi-ken; Hiroko Uyama, Miyagi-ken; Akihiro Makino; Naoya Hasegawa, both of Niigata-ken, all of Japan

[73] Assignees: Alps Electric Co., Ltd.; Kazuaki Fukamichi

[*] Notice: This patent issued on a continued prosecution application filed under 37 CFR 1.53(d), and is subject to the twenty year patent term provisions of 35 U.S.C. 154(a)(2).

[21] Appl. No.: 08/823,094

[22] Filed: Mar. 24, 1997

[30] Foreign Application Priority Data

Mar. 25, 1996 [JP] Japan ................................ 8-068819
Jan. 30, 1997 [JP] Japan ................................ 9-017147

[51] Int. Cl.[7] .................................................. G11B 5/39
[52] U.S. Cl. .............. 360/113; 428/694 T; 428/394 TM; 338/32 R
[58] Field of Search .................. 360/110, 113, 360/122, 124, 126; 324/252, 207.21; 365/8, 157, 158; 338/32 R, 32 H; 428/692, 694 R, 694 T, 694 TS, 694 TM, 900

[56] References Cited

U.S. PATENT DOCUMENTS

| | | | |
|---|---|---|---|
| 4,755,897 | 7/1988 | Howard | 360/113 |
| 4,782,413 | 11/1988 | Howard et al. | 360/113 |
| 5,315,468 | 5/1994 | Lin et al. | 360/113 |
| 5,471,358 | 11/1995 | Tadokoro et al. | 360/113 |
| 5,699,213 | 12/1997 | Ohyama et al. | 360/113 |
| 5,701,223 | 12/1997 | Fontana, Jr. et al. | 360/113 |

*Primary Examiner*—David L. Ometz
*Attorney, Agent, or Firm*—Brinks Hofer Gilson & Lione

[57] ABSTRACT

The present invention aims to provide an excellent exchange coupling thin film consisting of a completely novel material other than FeMn or NiMn and having excellent corrosion resistance and high resistivity, and a magnetoresistive element and a magnetic head each of which include the exchange coupling thin film. The exchange coupling thin film includes an antiferromagnetic film mainly composed of a crystal phase of a body-centered cubic structure and containing Cr and element M where element M contains at least one element of the 3B group elements in the Periodic Table, or Al, Ga or In, and a ferromagnetic film containing at least one of Fe, Ne, and Co, both films being laminated in contact with each other, wherein magnetic exchange coupling is generated in the interface between the antiferromagnetic film and the ferromagnetic film.

14 Claims, 16 Drawing Sheets

FIG. II

Si/ZnO/CrAl/NiFe

EXCHANGE COUPLING THIN FILM AND MAGNETORESISTIVE ELEMENT COMPRISING THE SAME

BACKGROUND OF THE INVENTION

1. Field of the Invention

The present invention relates to an exchange coupling thin film used for reading magnetic information from a magnetic recording medium by employing a magnetoresistive effect based on magnetic exchange coupling, and a magnetoresistive element and a magnetic head each comprising the same.

2. Description of the Related Art

Conventional magnetoresistive reading heads (MR heads) of prior art include AMR (Anisotropic Magnetoresistance) heads, and GMR (Giant Magnetoresistance) heads employing the spin-dependent scattering of conduction electrons. As an example of the GMR heads, U.S. Pat. No. 5,159,513 discloses a spin-valve head exhibiting a high magnetoresistive effect in low external magnetic fields (abbreviated to a "spin-valve head" hereinafter).

FIGS. 1 and 2 are schematic drawings of the structure of an AMR head element. In order to optimally operate an AMR head, two bias magnetic fields are required for an AMR ferromagnetic film 3 (AMR material layer) exhibiting the AMR effect. One of the bias magnetic fields is used for causing the resistance of an AMR material to change in linear response to a magnetic flux, and is perpendicular (in the Z direction shown in the drawings) to the plane of a magnetic medium and parallel to the film surface of the AMR ferromagnetic film 3. This bias magnetic field is generally referred to as a "lateral bias", and can be obtained by arranging a soft magnetic film 1 formed near the AMR ferromagnetic film 3 through an electric insulating layer 2 and passing a detection current through the AMR head from a conductive layer 5.

The other bias magnetic field is generally referred to as "longitudinal bias", and applied in parallel (in the X direction shown in the drawings) with the magnetic medium and the film surface of the AMR ferromagnetic film 3. The longitudinal bias magnetic field is applied for the purpose of suppressing the Barkhausen noise generated by the many magnetic domains formed in the AMR ferromagnetic film 3, i.e., for the purpose of causing a smooth change in resistance with the magnetic flux from the magnetic medium without noise.

In order to suppress the Barkhausen noise, it is necessary to form a single magnetic domain in the AMR ferromagnetic film 3. This is achieved by the following two methods for applying the longitudinal bias.

One method employs a leakage magnetic flux from the magnet layers 6 arranged on both sides of the AMR ferromagnetic film 3 (on both widthwise sides of the ferromagnetic film 3 formed to have a width corresponding to a track width shown in FIG. 2), as shown in FIG. 2. The other method employs the exchange anisotropic magnetic field generated in the contact interface between the ferromagnetic film 3 and the antiferromagnetic films 4 spaced on the AMR ferromagnetic film 3 in correspondence with the track width, as shown in FIG. 1.

On the other hand, in order to optimally operate the spin-valve head, in a sandwich structure comprising a free ferromagnetic film 7, a non-magnetic intermediate layer 8 and a pinned ferromagnetic film 9, as shown in FIG. 4, it is necessary that a bias in the track direction (in the X direction shown in the drawing) is applied to the free ferromagnetic film 7 so that the direction of magnetization is in the track direction with the single magnetic domain formed, and a bias in the Z direction shown in the drawings, i.e., in the direction perpendicular to the magnetization direction of the free ferromagnetic film 7, is applied to the pinned ferromagnetic film 9 so that the magnetization direction is in the Z direction shown in the drawing with the single magnetic domain formed. The magnetization direction of the pinned ferromagnetic film 9 must not be changed by a magnetic flux (in the Z direction shown in the drawings) from a magnetic medium, and the linear response of the magnetoresistive effect can be obtained by changing the magnetization direction of the free ferromagnetic film 7 within the range of 90±θ degrees with respect to the magnetization direction of the pinned ferromagnetic film 9.

In order to fix the magnetization direction of the pinned ferromagnetic film 9 in the Z direction shown in the drawings, a relatively large bias magnetic field is required, and the bias magnetic field is preferably as large as possible. A bias magnetic field of at least 100 Oe is required for overwhelming a diamagnetic field in the Z direction shown in the drawings and preventing the magnetization direction from fluctuating due to the magnetic flux from the magnetic medium.

A general method for obtaining this bias magnetic field is to employ the exchange anisotropic magnetic field produced by bringing an antiferromagnetic film 10 in contact with the pinned ferromagnetic film 9, as shown in FIG. 3 or 4.

The bias applied to the free ferromagnetic film 7 is adapted for ensuring the linear response and suppressing the Barkhausen noise generated by formation of many magnetic domains. As the method of applying this bias to the free ferromagnetic film 7, the same methods as those for applying the longitudinal bias to the AMR head, i.e., the method employing the leakage magnetic flux from the magnet layers 11 arranged on both sides of the free ferromagnetic film 7, as shown in FIG. 3, and the method employing the exchange anisotropic magnetic field generated in the contact interface with the antiferromagnetic films 13, as shown in FIG. 4, can generally be used.

As described above, the exchange anisotropic magnetic field generated in the contact interface with the antiferromagnetic films is employed for applying the longitudinal bias to the AMR head or applying the bias to the pinned ferromagnetic film and applying the bias to the free ferromagnetic film of the spin-valve head. As a result, a magnetoresistive head having good linear response and suppressed Barkhausen noise can be realized.

The exchange anisotropic magnetic field is the phenomenon caused by the exchange interaction between the magnetic moments of a ferromagnetic film and an antiferromagnetic film in the contact interface therebetween. As the antiferromagnetic film which produces an exchange anisotropic magnetic field for the ferromagnetic film, e.g., an NiFe film, an FeMn film is known well. However, the FeMn film has very poor corrosion resistance and thus has the problem that corrosion occurs and proceeds during the magnetic head manufacturing process and operation of a magnetic head, thereby deteriorating the exchange anisotropic magnetic field and damaging the magnetic medium. In addition, during the operation of the magnetic head, the temperature in the vicinity of the FeMn film is known to increase to about 120° C. due to the heat generated by the detection current. However, the exchange anisotropic magnetic field generated by the FeMn film is sensitive to temperature changes, and substantially linearly decreases with temperature rises to about 150° C. (blocking temperature: Tb) at which it disappears. Thus there is also the problem of making it impossible to obtain a stable exchange anisotropic magnetic field.

As an invention relating to improvements in the corrosion resistance and blocking temperature of an FeMn film, for example, U.S. Pat. No. 5,315,468 discloses an NiMn alloy or NiMnCr alloy which has a face-centered tetragonal structure. However, the corrosion resistance of the NiMn film is higher than that of the FeMn film, but is insufficient for practical use. Although the NiMnCr film comprises an alloy containing Cr which is added for improving the corrosion resistance of the NiMn film, and the corrosion resistance is improved by adding Cr, the level of the exchange anisotropic magnetic field is decreased.

SUMMARY OF THE INVENTION

The present invention has been achieved in consideration of the above situation, and an object of the present invention is to provide an excellent exchange coupling thin film with an excellent corrosion resistance and high resistivity, and a magnetoresistive element and a magnetic head each comprising the exchange coupling thin film which has a structure being capable of producing magnetic exchange coupling between an antiferromagnetic film and a ferromagnetic film, and comprising a completely novel material other than FeMn and NiMn, and also.

In order to achieve the object of the present invention, there is provided an exchange coupling thin film comprising an antiferromagnetic film mainly comprising a body-centered cubic structure crystal phase consisting of Cr and element M where element M contains at least one element of 3b group elements in the Periodic Table, including Al, Ga and In, and a ferromagnetic film containing at least one of Fe, Ni and Co, both films being laminated in contact with each other, wherein magnetic exchange coupling is generated in the interface between the antiferromagnetic film and the ferromagnetic film.

In order to achieve the object of the present invention, the antiferromagnetic film is oriented with preference to either {100} or {110}.

In addition, the crystal grain size D of the antiferromagnetic film is preferably smaller than the magnetic domain wall width $\delta_{AF}$ thereof.

Furthermore, the crystal grain size D of the antiferromagnetic film is $D \leq 300$ Å.

In order to achieve the object of the present invention, the exchange coupling thin film is formed on a substrate through a base film which comprises at least one of MgO, AlN, Ta, ZnO, Si and Fe—Ni alloys.

In order to achieve the object of the present invention, the natural corrosion potential of the antiferromagnetic film is a positive value relative to a saturated calomel electrode.

In order to achieve the object of the present invention, the thickness of the antiferromagnetic film is 300 Å or more.

In accordance with the present invention, the resistivity of the antiferromagnetic film is 500 $\mu\Omega$cm or more.

In accordance with the present invention, the antiferromagnetic film is represented by the following composition formula:

$$Cr_xM_y$$

wherein the composition ratios x and y are by atomic % and are within the ranges of $60 \leq x \leq 95$ and $5 \leq y \leq 40$, respectively, and M represents at least one element of Al, Ga and In.

In accordance with the present invention, the composition ratios x and y are preferably within the ranges of $65 \leq x \leq 80$ and $20 \leq y \leq 35$, respectively.

With less than 10 atomic % of Al, the exchange anisotropic magnetic field $\{H_{ex}\}$ undesirably deteriorates (substantially zero). With over 40 atomic % of Al, the bcc phase is not precipitated, and thus the exchange anisotropic magnetic field undesirably deteriorates. Within these ranges, the Al content is more preferable 20 to 35 atomic %, resulting in the achievement of a high exchange anisotropic magnetic field.

In order to achieve the object of the present invention, there is provided a magnetoresistive element comprising an exchange coupling thin film comprising an antiferromagnetic film of a body-centered cubic structure consisting of Cr and element M where element M contains at least one element of 3b group elements in the Periodic Table, including Al, Ga, and In, and a ferromagnetic film consisting of at least one of Fe, Ni and Co, both films being laminated in contact with each other, and magnetic exchange coupling being produced in the interface between the antiferromagnetic film and the ferromagnetic film to apply a longitudinal bias to the ferromagnetic flim; and a soft magnetic film laminated on the exchange coupling thin film through at least a non-magnetic film to apply a lateral bias to the ferromagnetic film.

In order to achieve the object of the present invention, there is provided a magnetoresistive element comprising an exchange coupling thin film comprising an antiferromagnetic film of a body-centered cubic structure consisting of Cr and element M where element M contains at least one element of 3b group elements in the Periodic Table, including Al, Ga and In, and a ferromagnetic film consisting of at least one of Fe, Ni and Co, both films being laminated in contact with each other, and magnetic exchange coupling being produced in the interface between the antiferromagnetic film and the ferromagnetic film to render the ferromagnetic film a pinned magnetic film; and a ferromagnetic film with a single magnetic domain formed therein which is laminated on the exchange coupling thin film through at least a non-magnetic film.

In order to achieve the object of the present invention, there is provided a magnetic head comprising a magnetoresistive element for reading magnetic record from a magnetic recording medium, which element comprises an exchange coupling thin film comprising an antiferromagnetic film of a body-centered cubic structure consisting of Cr and element M where element M contains at least one element of 3b group elements in the Periodic Table, including Al, Ga and In, and a ferromagnetic film consisting of at least one of Fe, Ni and Co, both films being laminated in contact with each other, and magnetic exchange coupling being produced in the interface between the antiferromagnetic film and the ferromagnetic film to apply a longitudinal bias to the ferromagnetic film, and a soft magnetic film laminated on the exchange coupling thin film through at least a non-magnetic film to apply a lateral bias to the ferromagnetic film; and an inductive head for writing magnetic record on the magnetic recording medium, which head comprises a magnetic core consisting of a soft magnetic material, for forming at least a magnetic circuit, a magnetic gap and a coil.

In order to achieve the object of the present invention, there is provided a magnetic head comprising a magnetoresistive element which comprises an exchange coupling thin film comprising an antiferromagnetic film of a body-centered cubic structure consisting of Cr and element M where element M contains at least one element of 3b group elements in the Periodic Table, including Al, Ga and In, and a ferromagnetic film consisting of at least one of Fe, Ni and Co, both films being laminated in contact with each other, and magnetic exchange coupling being produced in the interface between the antiferromagnetic film and the ferromagnetic film to render the ferromagnetic film a pinned magnetic film, and a ferromagnetic film with a single magnetic domain formed therein which laminated on the exchange coupling thin film through at least a non-magnetic film; and an inductive head for writing magnetic record in a magnetic recording medium, which head comprises a magnetic core consisting of a soft magnetic material for forming at least a magnetic circuit, a magnetic gap and a coil.

The exchnage coupling thin film of the present invention comprises an antiferromagnetic film of a body-centered cubic structure consisting of Cr and element M where element M contains at least one element of 3$b$ group elements in the Periodic Table, including Al, Ga and In, and a ferromagnetic film consisting of at least one Fe, Ni and Co, both film being laminated in contact with each other, wherein magnetic exchange coupling is generated in the interface between the antiferromagnetic film and the ferromagnetic film. It is thus possible to obtain a structure having excellent corrosion resistance and high resistivity, as compared with FeMn which constitutes a conventional known antiferromagnetic film, and being capable of imparting magnetic exchange coupling.

The exchange coupling thin film of the present invention can thus be used as a magnetoresistive element or for an MR head comprising the exchange coupling thin film.

The exchange coupling thin film of the present invention can also be applied to all of a longitudinal bias applying structure in an AMR head, a pinning bias structure for a pinned layer in a spin-valve head, a bias applying structure for a free ferromagnetic film and a pinning bias structure for a pinned ferromagnetic film. The application of the exchange coupling thin film to these structures can achieve a magnetic head having excellent corrosion resistance, high resistivity and excellent linear response to changes in magnetic resistance and being capable of exhibiting magnetic exchange coupling.

In the formation of the exchange coupling thin film, MgO, AlN, Ta or ZnO can be used as a base film, and the use of such a base film can form an exchange coupling thin film comprising an antiferromagnetic film or a ferromagnetic film having excellent orientation. In addition, if the thickness of the antiferromagnetic film is within the range of 300 to 1500 Å, an excellent exchange anisotropic magnetic field of high value can be obtained, thereby providing the exchange coupling thin film having excellent exchange coupling properties.

DESCRIPTION OF THE PREFERRED EMBODIMENT

An embodiment of the present invention will be described below with reference to the drawings.

An exchange coupling thin film of the present invention basically has an antiferromagnetic film of a body-centered cubic structure consisting of Cr and element M where element M contains at least one element of 3b group elements in the Periodic Table, including Al, Ga and In, and a ferromagnetic film consisting of at least one of Fe, Ni and Co, both films being laminated in contact with each other, wherein magnetic exchange coupling is generated in the interface between the antiferromagnetic film and the ferromagnetic film. Specifically, the exchange coupling thin film is represented by the composition formula Cr—(Al, Ga, In).

In the above structure, the antiferromagnetic film is represented by, for example, the following composition formula:

$$Cr_xM_y$$

wherein the composition ratios x and y are within the ranges of $60 \leq x \leq 95$ and $5 \leq y \leq 40$, respectively. When element M is Al, the composition ratios x and y are preferably within the ranges of $60 \leq x \leq 90$ and $10 \leq y \leq 40$, more preferably within the ranges of $65 \leq x \leq 80$ and $20 \leq y \leq 35$, respectively. When element M is Ga, the composition ratios x and y are preferably within the ranges of $85 \leq x \leq 95$ and $5 \leq y \leq 15$, respectively.

With less than 10 atomic % of Al, an exchange anisotropic magnetic field (Hex) undesirably deteriorates (substantially zero). With over 40 atomic % of Al, the bcc phase is not precipitated, and also the exchange anisotropic magnetic filed undesirably deteriorates. In these ranges, an Al content is more preferably 20 to 35 atomic % in order to obtain a higher exchange anisotropic magnetic field.

Figure 1:
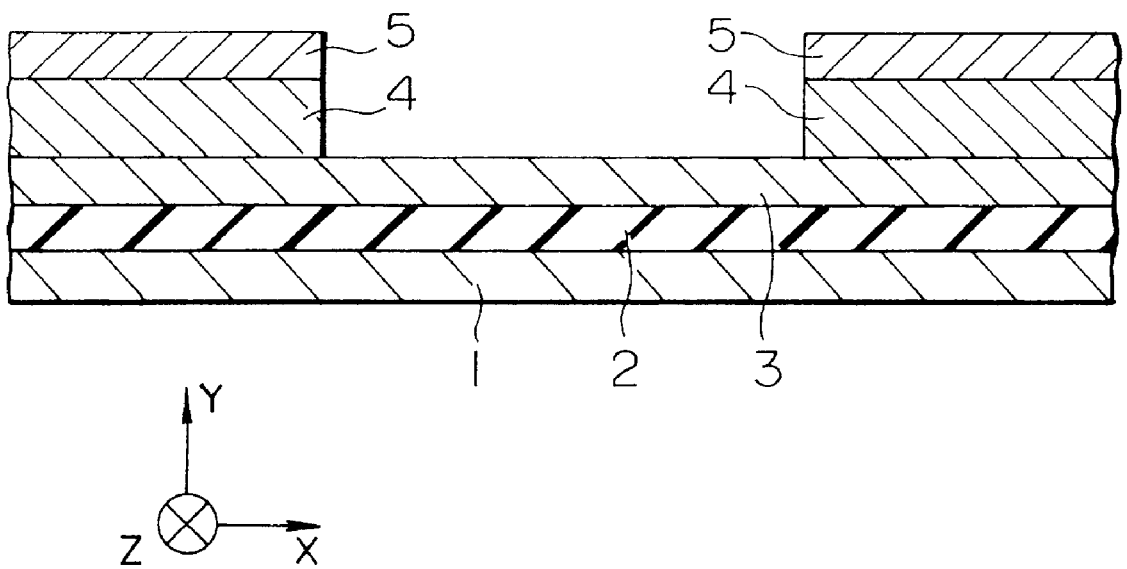
FIG. 1 is a drawing illustrating the structure and bias magnetic field of an example of an AMR head to which the present invention is applied.
Figure 2:
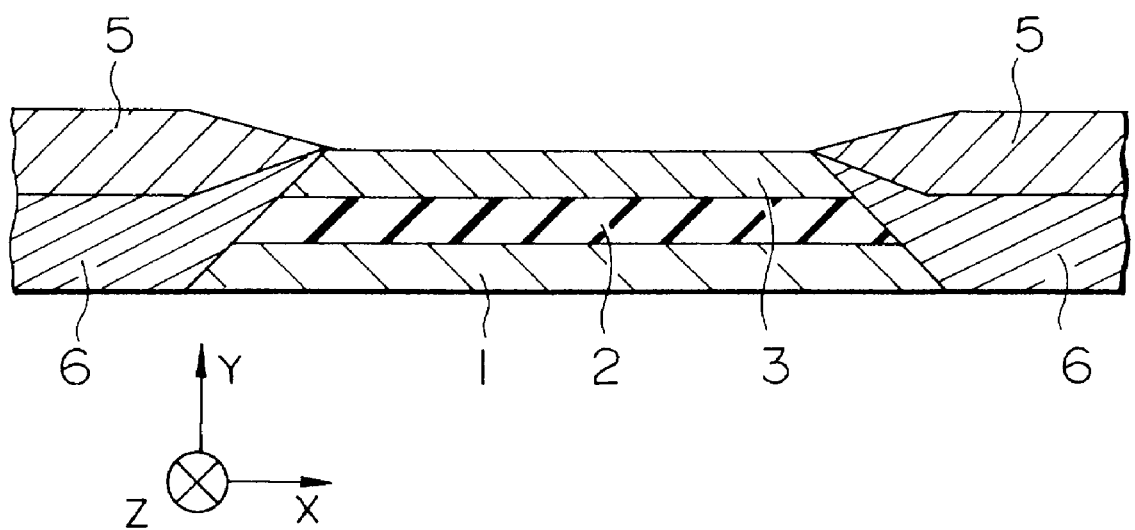
FIG. 2 is a drawing illustrating the structure and bias magnetic field of another example of an AMR head to which the present invention is applied.

The above-mentioned structure can be applied to a longitudinal bias in the AMR head shown in FIG. 1. In the structure shown in FIG. 1, an antiferromagnetic film 4 comprises an alloy film of the body-centered cubic structure consisting of Cr and element M where element M contains at least one element of 3b group elements in the Periodic Table, including Al, Ga and In, and a ferromagnetic film 3 comprising an alloy film consisting of at least one of Fe, Ni and Co. In the structure shown in FIGS. 3 and 4, an antiferromagnetic film 10 or 13 comprises an alloy film of the body-centered cubic structure consisting of Cr and element M where element M contains at least one element of 3b group elements in the Periodic Table, including Al, Ga and In, and a pinned ferromagnetic film 9 or a free ferromagnetic film 7 comprises an alloy film consisting of at least one of Fe, Ni and Co.

Figure 3:
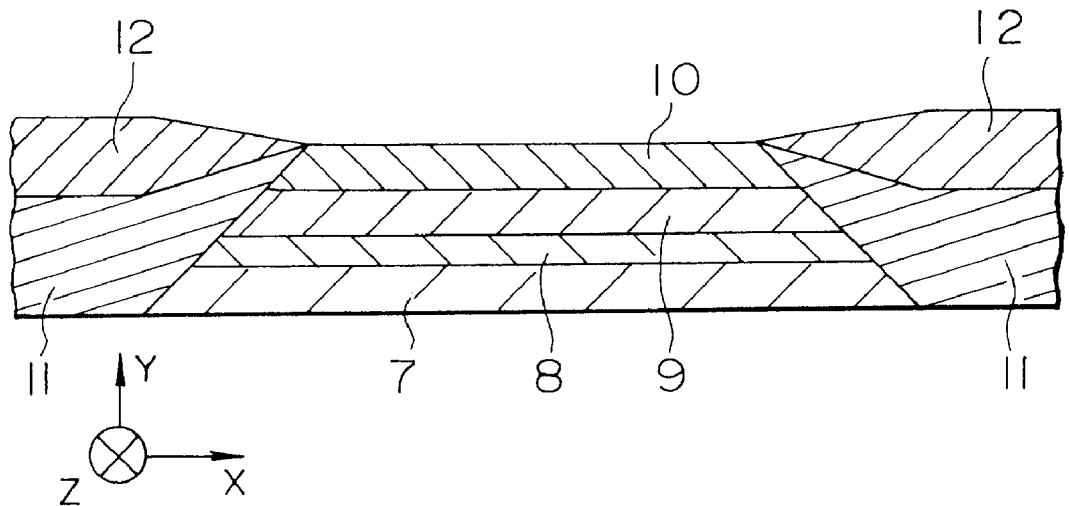
FIG. 3 is a drawing illustrating the structure and bias magnetic field of an example of a spin-valve head to which the present invention is applied.
Figure 4:
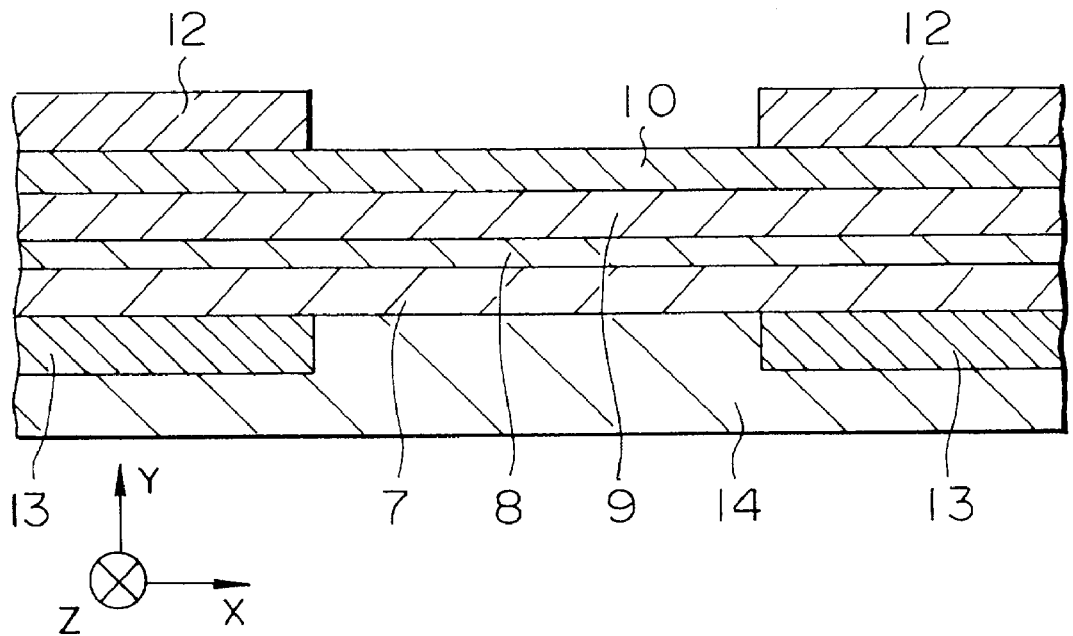
FIG. 4 is a drawing illustrating the structure and bias magnetic field of another example of a spin-valve head to which the present invention is applied.

The above structure permits the exchange coupling thin film of the present invention to be applied to all of a longitudinal bias structure of the AMR head shown in FIG. 1, a pinning bias structure for the pinned layer 9 of the spin-valve head shown in FIG. 3, and a bias applying structure for the free ferromagnetic film and the pinning bias structure for the pinned ferromagnetic film 9 shown in FIG. 4.

In the structure of the present invention, the antiferromagnetic film is oriented with preference to either 100 or 110. In addition, it is more preferable that either of these crystal faces is exposed to the film surface, and in such an orientation state, the crystal axes perpendicular to the <100> axis or <110> axis are randomly oriented in the film plane.

The exchange coupling thin film is generally formed on a substrate, and in the film formation, films are preferably formed in turn after a base film is formed on the substrate.

As the base film, at lease one of MgO, AlN, Ta, ZnO and Si can be used. The formation of such a base film can stabilize the film quality of the antiferromagnetic film or the ferromagnetic film formed on the base film, and permits control of crystal orientation.

Furthermore, the antiferromagnetic film preferably has a natural corrosion potential of a positive value (0 V or more), more preferably 0.1 V or more, in 0.1N sodium nitrite (Na$_2$SO$_3$.7H$_2$O) relative to a saturated calomel electrode. In this point, the above-mentioned composition can easily attain a natural corrosion potential within this range. The thickness of the antiferromagnetic film is preferably within the range of 300 to 1500 Å. With a film thickness out of the range of 300 to 1500 Å, the exchange bias magnetic field is undesirably decreased.

The antiferromagnetic film having a resistivity of 500 $\mu\Omega$cm or more can easily be obtained. In the case of a high resistivity, it is possible to prevent the detection current flowing through a spin-valve magnetoresistive element from being shunted to the antiferromagnetic film. Namely, the antiferromagnetic film has the effect of minimizing the shunt of current, which does not contribute to a resistance change, and increasing the rate of change in resistance of the element.

EXAMPLES

All films were formed by conventional RF (Radio Frequency) sputtering or DC sputtering. On a plurality of Si substrates were deposited Cr$_{81}$Al$_{19}$ films respectively having thicknesses of 100 Å, 500 Å, 900 Å and 2000 Å, and Ni$_{81}$Fe$_{19}$ films each having a thickness of 50 Å by using as a target an Al target on which Cr pellets were arranged. An X-ray diffraction curve of each of the samples was measured. As the target, besides the above target, a composite target comprising a Cr$_{70}$Al$_{30}$ alloy on which Cr pellet were arranged may be used.

Figure 5:
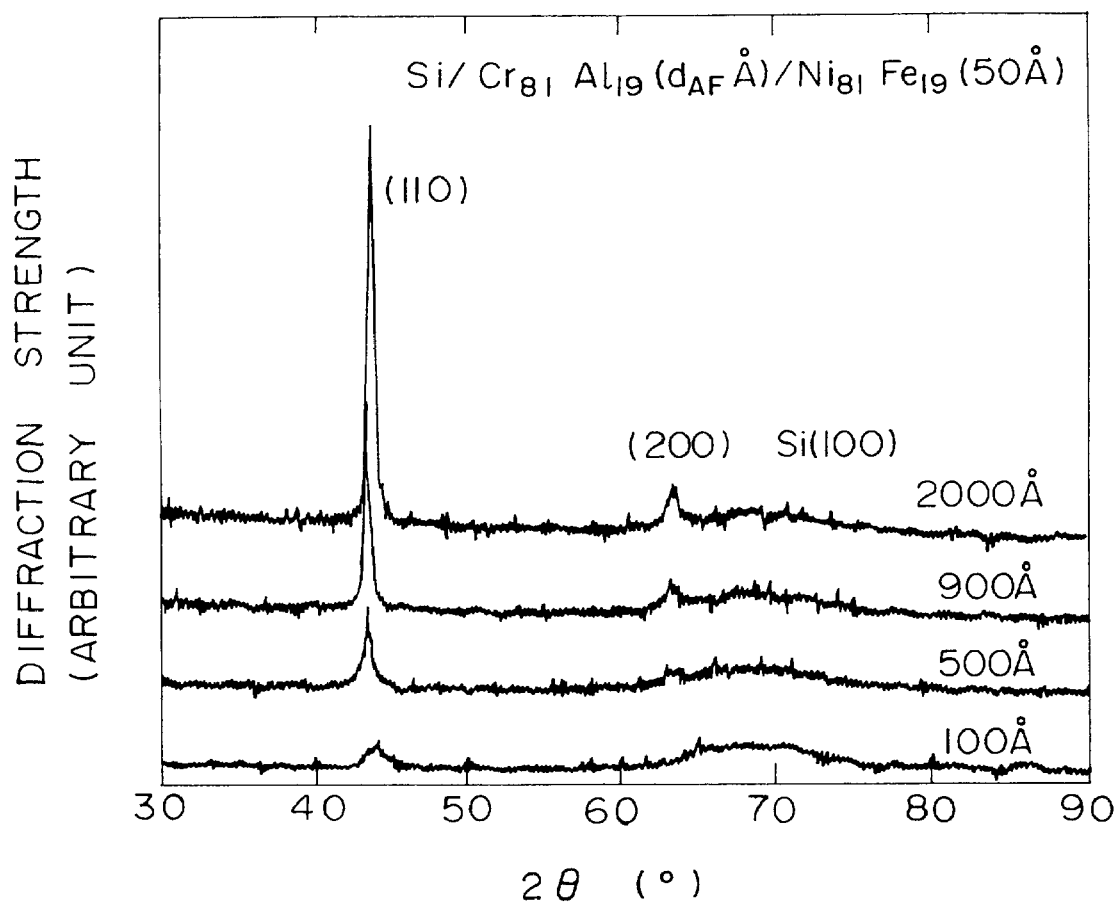
FIG. 5 is a chart showing the X-ray diffraction patterns of exchange coupling thin films each comprising a $Cr_{81}Al_{19}$ film of 100 to 2000 Å thick and an $Ni_{81}Fe_{19}$ film which were laminated in turn on each of Si substrates.

The results of measurement are shown in FIG. 5.

As seen from the results shown in FIG. 5, a (110) peak was observed near 2θ=43.8° in each of the samples having a Cr$_{81}$Al$_{19}$ film thickness of 500 to 2000 Å. In addition, a (200) peak was observed near 64.050 in each of the samples respectively having Cr$_{81}$Al$_{19}$ film thicknesses of 900 and 2000 Å. It was thus confirmed that, of these samples, the samples having a Cr$_{81}$Al$_{19}$ film thickness of 500 to 2000 Å have the body-centered cubic structure. In FIG. 5, a weak peak near 2θ=70° is the (100) peak of the Si substrate, and thus indicates that the surface of the Si substrate has (100) orientation.

Figure 6:
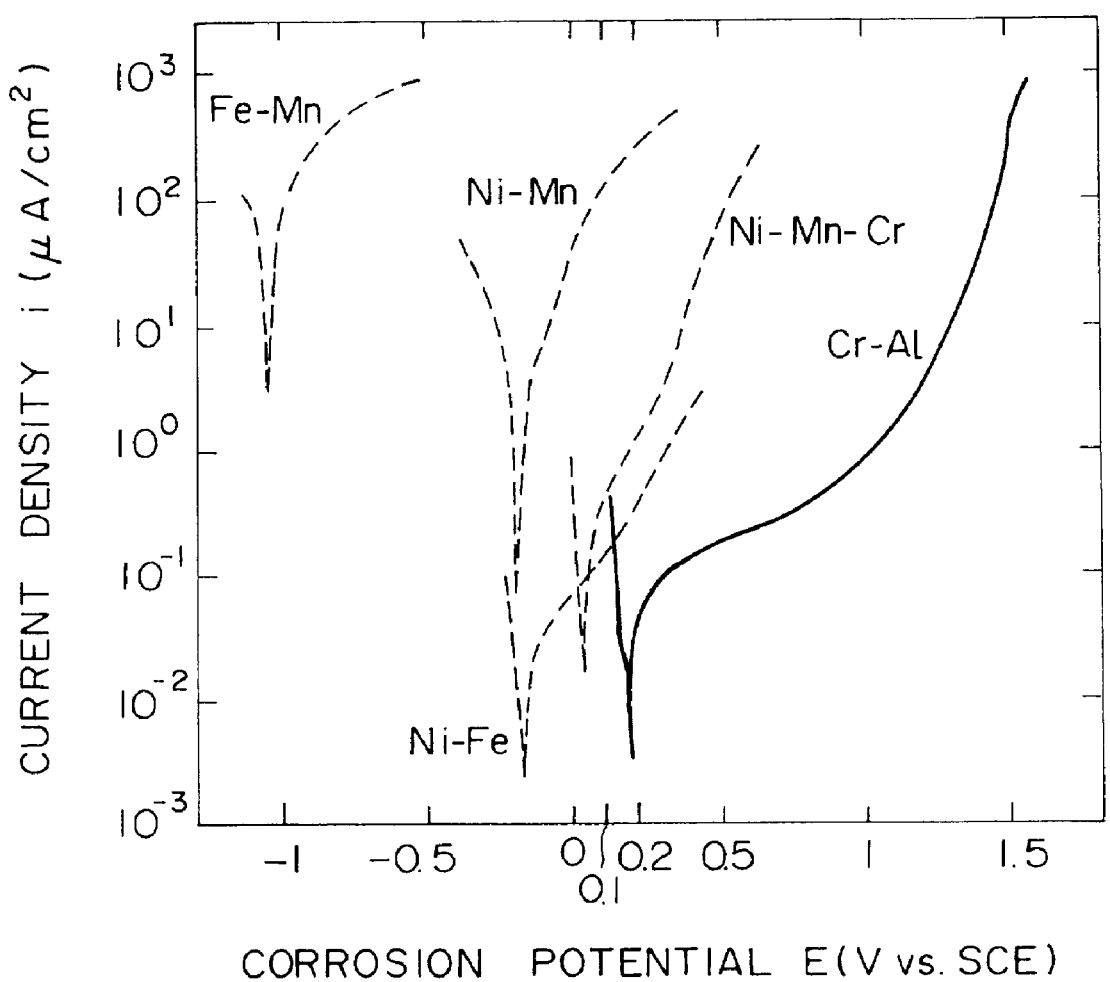
FIG. 6 is a graph showing the corrosion potential of CrAl which is applied to an exchange coupling thin film in accordance with the present invention.

FIG. 6 shows a comparison of the corrosion potentials of various conventional known antiferromagnetic films and an antiferromagnetic film of the present invention. FIG. 6 shows the polarization curves of these materials when they were immersed in 0.1N sodium nitrite (Na$_2$SO$_3$.7H$_2$O). If the potential of a saturated calomel electrode is 0 V, a material having a potential higher than 0 V is excellent in corrosion resistance. It is thus found that the Cr—Al antiferromagnetic film of the present invention has always a corrosion potential of a positive value of 0.1 V or more, while the antiferromagnetic films of FeMn, NiMn, NiFe and NiMnCr have low corrosion potentials and are liable to corrode, as compared with the composition system of the present invention. In FIG. 6, a curve nearer the right side of the drawing has more excellent corrosion resistance.

Figure 7:
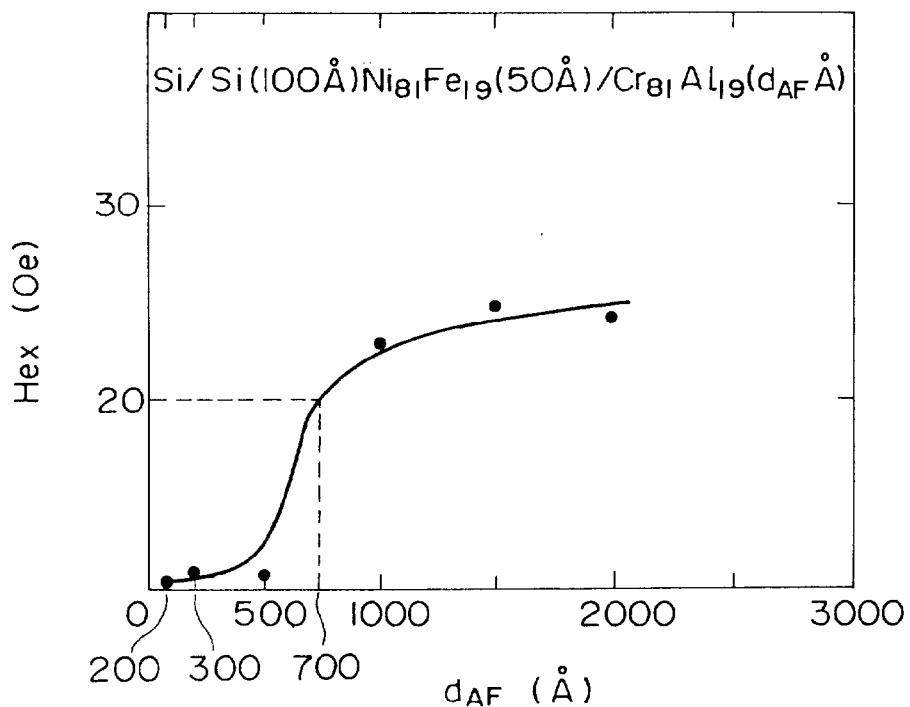
FIG. 7 is a graph showing the dependency of an exchange anisotropic magnetic field on the film thickness with respect to exchange coupling thin films each comprising an Si base film, an $Ni_{81}Fe_{19}$ film and a $Cr_{81}Al_{19}$ film which were laminated in turn on each of Si substrates while changing the thickness of the $Cr_{81}Al_{19}$ film.

FIG. 7 shows the results of measurement of the dependency of the exchange anisotropic magnetic field ($H_{ex}$) on the $Cr_{81}Al_{19}$ film thickness with respect to exchange coupling thin films each comprising an Si base film of 100 Å thick, an $Ni_{81}Fe_{19}$ film of 50 Å and a $Cr_{81}Al_{19}$ film, which are formed in turn on an Si substrate while changing the thickness of the $Cr_{81}Al_{19}$ film.

This figure indicates that when a CrAl film is laminated on an NiFe film to form an exchange coupling thin film, the thickness of the CrAl film is preferably increased to some extent, specifically, 300 Å or more, in order to obtain a high exchange anisotropic magnetic field ($H_{ex}$). Specifically, in order to obtain an exchange anisotropic magnetic field ($H_{ex}$) of 20 or more, the thickness is preferably 700 to 2000 Å.

Figure 8:
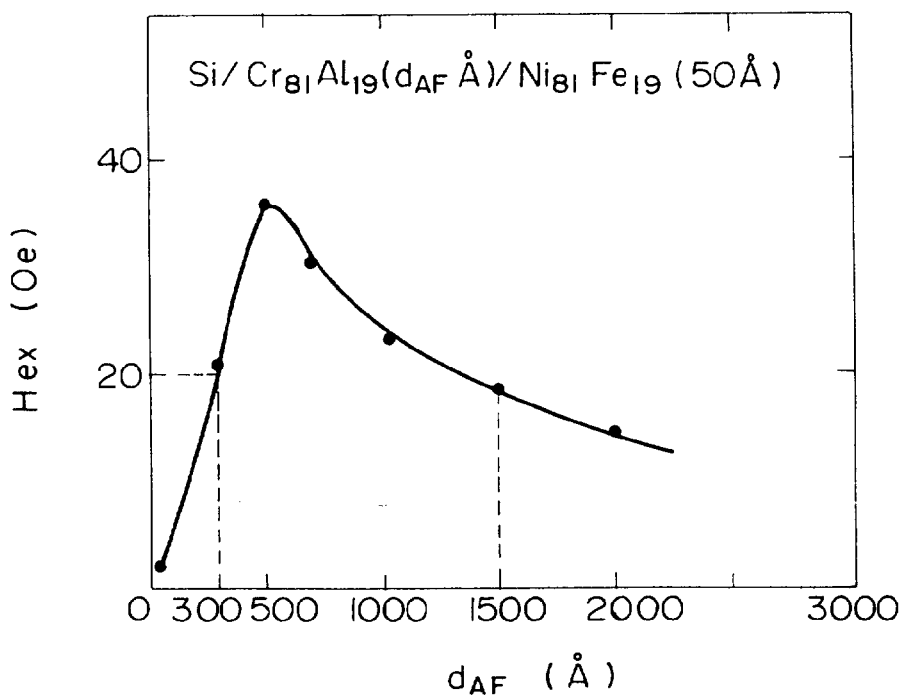
FIG. 8 is a graph showing the dependency of an exchange anisotropic magnetic field on the film thickness with respect to exchange coupling thin films each comprising a $Cr_{81}Al_{19}$ film and an $Ni_{81}Fe_{19}$ film which were laminated in turn on each of Si substrates while changing the thickness of the $Cr_{81}Al_{19}$ film.

FIG. 8 shows the results of measurement of the dependency of the exchange anisotropic magnetic field on the $Cr_{81}Al_{19}$ film thickness with respect to exchange coupling thin films each comprising a $Cr_{81}Al_{19}$ film and an $Ni_{81}Fe_{19}$ film of 50 Å which are formed in turn on an Si substrate while changing the thickness of the $Cr_{81}Al_{19}$ film.

This figure indicates that when an NiFe film was laminated on a CrAl film, the CrAl thickness is preferably increased to some extent in order to obtain a high exchange anisotropic magnetic field ($H_{ex}$ of 20 or more) Specifically, the CrAl film thickness is preferably within the range of 300 to 1500 Å, and more preferably within the range of 300 to 1000 Å.

Figure 9:
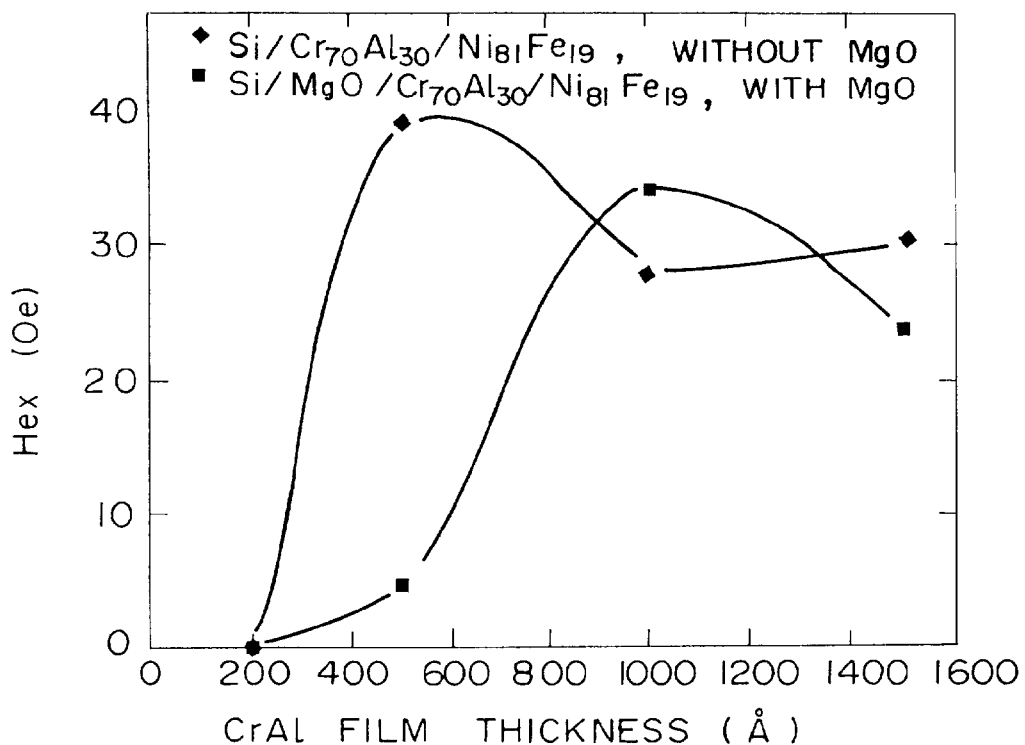
FIG. 9 is a graph showing a comparison of the dependency of an exchange anisotropic magnetic field on the CrAl film thickness with respect to exchange coupling thin films each comprising a $Cr_{70}Al_{30}$ film and an $Ni_{81}Fe_{19}$ film which are laminated in turn on each of Si substrates, while changing the thickness of the $Cr_{70}Al_{30}$ film, with the dependency of an exchange anisotropic magnetic field on the CrAl film thickness with respect to exchange coupling thin films each comprising an MgO film, a $Cr_{70}Al_{30}$ film and an $Ni_{81}Fe_{19}$ film which were laminated in turn on each of Si substrates.

FIG. 9 shows the dependency of the exchange anisotropic magnetic field on the CrAl film thickness obtained by a structure (without MgO) comprising a $Cr_{70}Al_{30}$ film and an $Ni_{81}Fe_{19}$ film of 50 Å which are formed in turn on an Si substrate, and the dependency of the exchange anisotropic magnetic field on the CrAl film thickness obtained by a structure (with MgO) comprising a $Cr_{70}Al_{30}$ film and an $Ni_{81}Fe_{19}$ film of 50 Å which are formed in turn on an Si substrate through a MgO film.

The results shown in FIG. 9 indicate that in the structure without the MgO film, with a $Cr_{70}Al_{30}$ film thickness of 200 Å, no exchange anisotropic magnetic field can be obtained, while with a $Cr_{70}Al_{30}$ film thickness of over 200 Å, the exchange anisotropic magnetic field can be obtained, and the value of the exchange anisotropic magnetic field is rapidly increased to 20 Oe or more at a $Cr_{70}Al_{30}$ film thickness of 300 Å or more. It is also found that in order to obtain an exchange anisotropic magnetic field of 30 Oe or more, the $Cr_{70}Al_{30}$ film thickness is preferably within the range of 400 to 900 Å.

It is also found that in the structure comprising a $Cr_{70}Al_{30}$ film and an $Ni_{81}Fe_{19}$ film which are formed in turn on the base film on an Si substrate through a MgO film, with a $Cr_{70}Al_{30}$ film thickness of 700 Å, an exchange anisotropic magnetic field of 20 Oe or more can be obtained. It is further found that in order to obtain an exchange anisotropic magnetic field of 30 Oe or more, the $Cr_{70}Al_{30}$ film thickness is preferably within the range of 900 to 1300 Å.

The results shown in FIGS. 8 and 9 reveal that even if the CrAl composition is slightly changed, regardless of the presence of the MgO film as the base film, a good exchange anisotropic magnetic field can be obtained with a CrAl film thickness within the range of 300 to 1500 Å.

Figure 10:
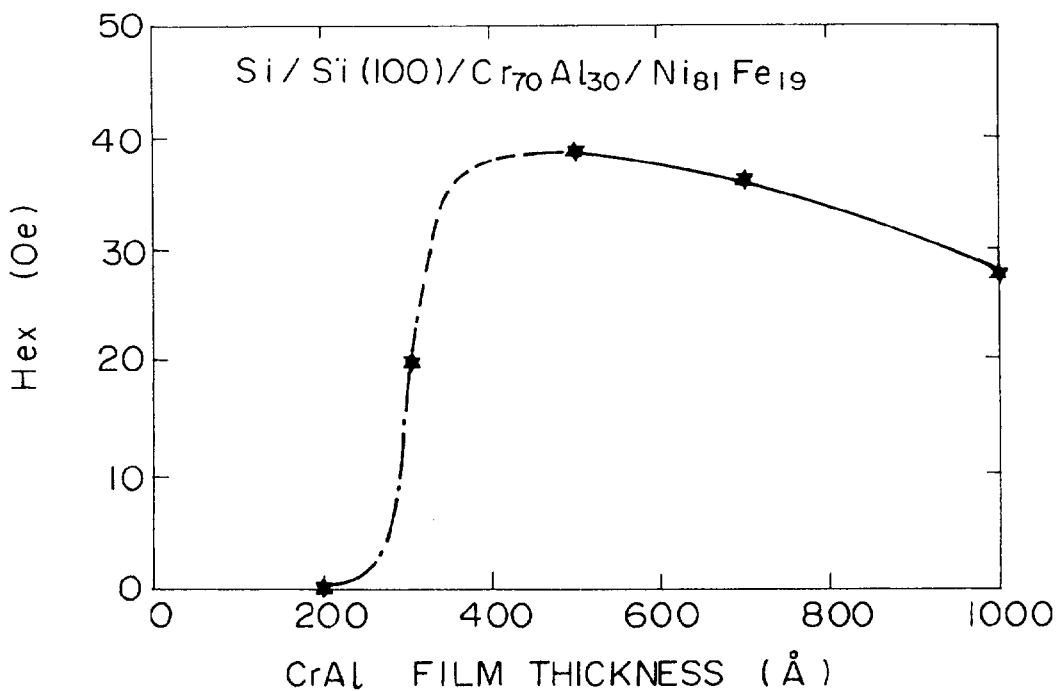
FIG. 10 is a graph showing the dependency of an exchange anisotropic magnetic field on the CrAl film thickness with respect to exchange coupling thin films each comprising an Si film, a $Cr_{70}Al_{30}$ film and an $Ni_{81}Fe_{19}$ film which were laminated in turn on each of Si substrates while changing the thickness of the $Cr_{70}Al_{30}$ film.

FIG. 10 shows the dependency of the exchange anisotropic magnetic field on the $Cr_{70}Al_{30}$ film thickness with respect to an exchange coupling thin film comprising an Si layer (100) of 100 Å, a $Cr_{70}Al_{30}$ and an $Ni_{81}Fe_{19}$ film of 50 Å which are formed in turn on an Si substrate.

The results shown in FIG. 10 indicate that with a $Cr_{70}Al_{30}$ film thickness of over 200 Å, the exchange anisotropic magnetic field rapidly increases to 20 Oe or more at a $Cr_{70}Al_{30}$ film thickness of over 300 Å. It is also found that in order to obtain an exchange anisotropic magnetic field of 30 Oe or more, the $Cr_{70}Al_{30}$ film thickness is preferably within the range of 400 to 900 Å.

Figure 11:
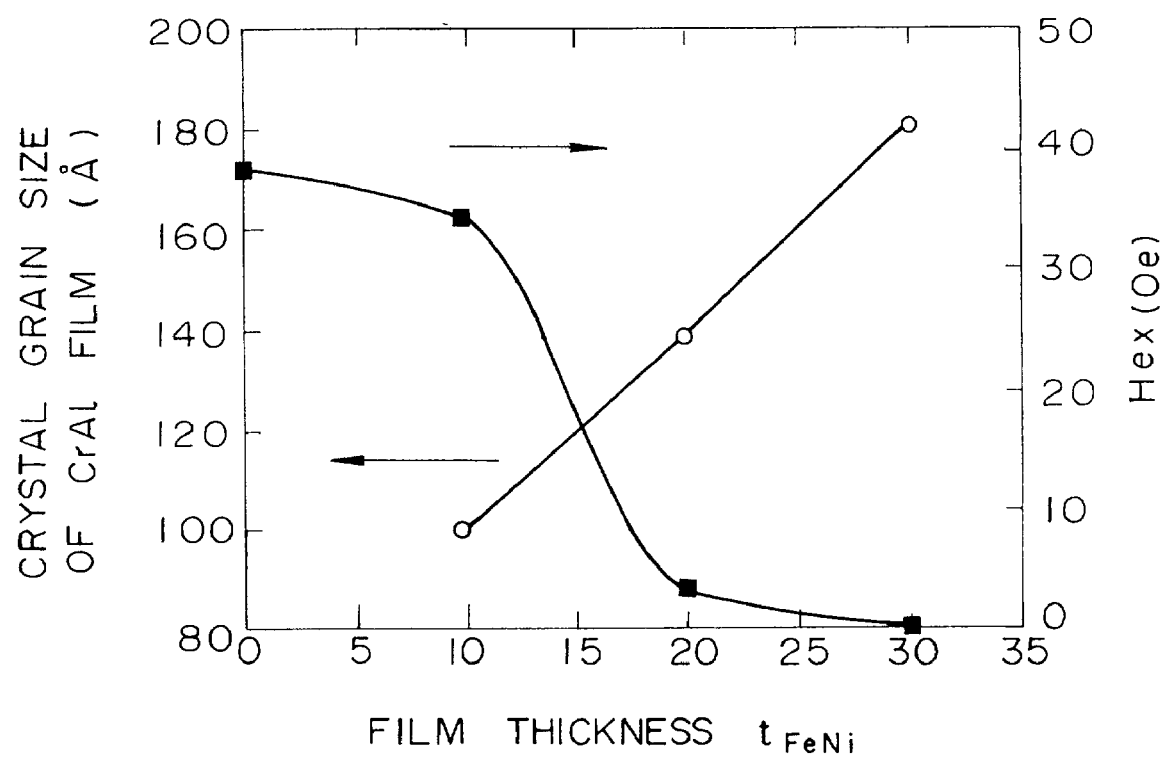
FIG. 11 is a graph showing the dependency of the crystal grain size of the CrAl film and exchange anisotropic magnetic field on the NiFe film thickness with respect to exchange coupling thin films each comprising a $Cr_{70}Al_{30}$ film and an $Ni_{81}Fe_{19}$ film which were laminated in turn on each of Si substrates.

FIG. 11 shows the results of measurement of the exchange anisotropic magnetic field (Hex) and the crystal grain size of a $Cr_{70}Al_{30}$ film in the direction of the thickness thereof with respect to a sample comprising an Si layer (100 Å), an $Ni_{81}Fe_{19}$ film (t Å), a $Cr_{70}Al_{30}$ (500 Å) and an $Ni_{81}Fe_{19}$ film (50 Å) which were formed in turn on an Si substrate.

Figure 12:
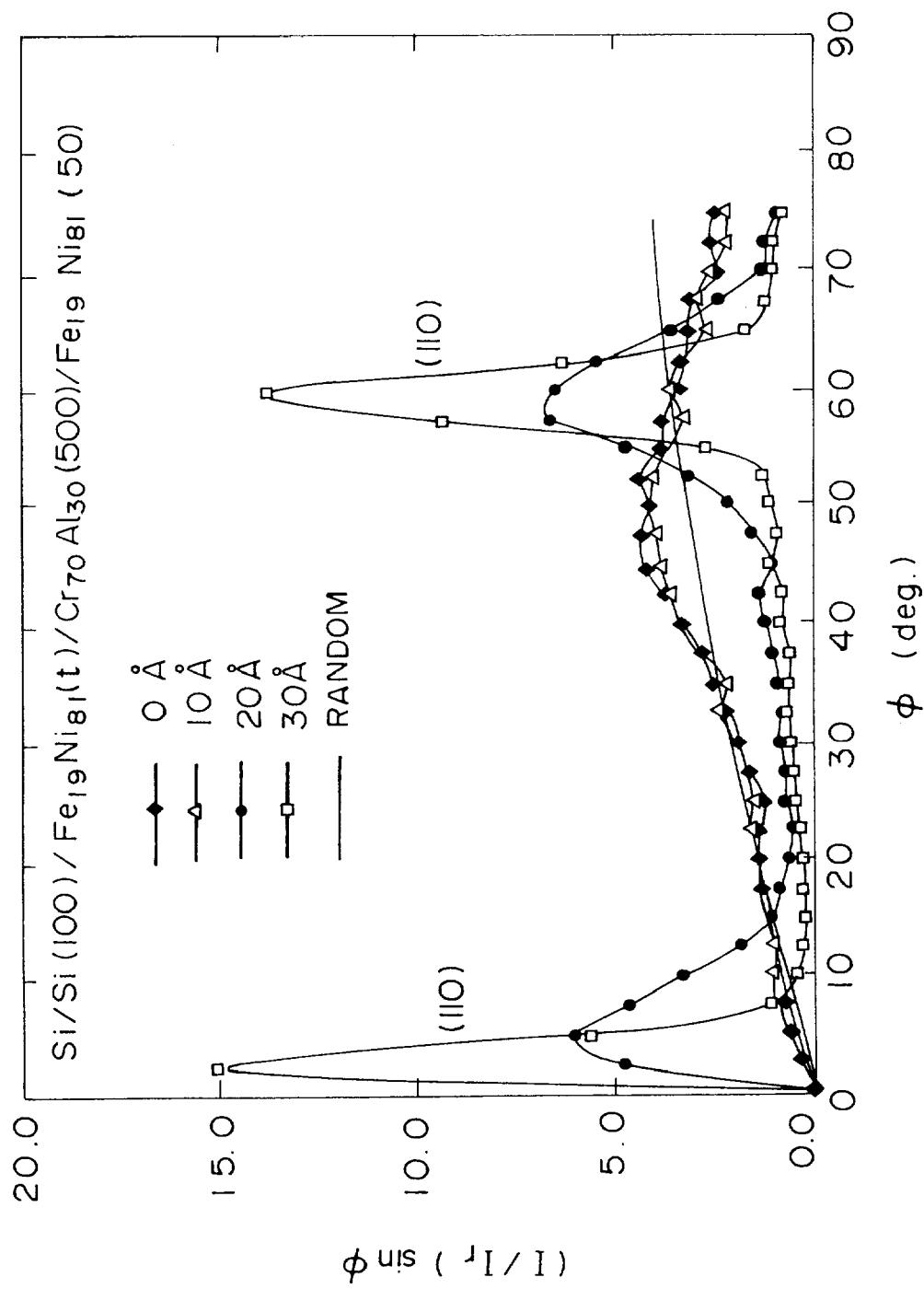
FIG. 12 is a graph showing the results of measurement of the normalized degree of (110) orientation of structures each comprising an Si layer, an $Ni_{81}Fe_{19}$ film, a $Cr_{70}Al_{30}$ film and an $Ni_{81}Fe_{19}$ film which were laminated in turn on each of Si substrates while changing the thickness of the $Ni_{81}Fe_{19}$ film.

FIG. 12 shows the results of measurement of the degree of orientation with respect to a structure comprising an Si layer (100) of 100 Å thick, an $Ni_{81}Fe_{19}$ film, a $Cr_{70}Al_{30}$ film of 500 Å and a $Cr_{70}Al_{30}$ film of 50 Å which were formed in turn on an Si substrate while changing the thickness of $Ni_{81}Fe_{19}$ film to 10 Å, 20 Å and 30 Å, and the same structure except the $Ni_{81}Fe_{19}$ film was not provided. FIG. 12 shows the normalized degree of {110} orientation of the $Cr_{70}Al_{30}$ film which was measured while changing the thickness of the $Ni_{81}Fe_{19}$ film as an intermediate layer and normalized on the basis of an non-oriented sample.

Figure 13:
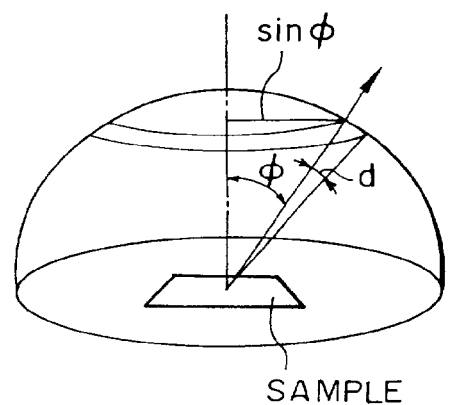
FIG. 13 is a drawing illustrating the angle Ø used for the normalized degree of (110) orientation shown in FIG. 12.

In FIG. 12, angle Ø is defined to Ø=0 deg in the direction normal to the laminated films, as shown in FIG. 13. ($I/I_r$) sin Ø shown on the ordinate indicates the amount of the average pole density at angle Ø which was normalized based on the pole density of the non-oriented sample represented by the following equation (I):

$$Ir = \int_0^{\pi/2} I \sin\emptyset d\emptyset \tag{I}$$

The results shown in FIGS. 11 and 12 indicate that {110} orientation is improved as the thickness of the $Ni_{81}Fe_{19}$ film as an intermediate film increases. Namely, it is found that as the thickness of the $Ni_{81}Fe_{19}$ film as an intermediate layer increases, {110} orientation of the $Cr_{70}Al_{30}$ film is improved, the crystal gain size increases, and the exchange anisotropic magnetic field decreases. It is thought from the results shown in FIG. 11 that since the crystal grain size increases as the thickness of the $Ni_{81}Fe_{19}$ film increases, the crystal orientation is improved, and interfacial inequalities decrease, resulting in a decrease in the exchange anisotropic magnetic field.

The presence of interfacial inequalities in the laminate interface contributes to the generation of the exchange anisotropic magnetic field. This is thought to be due to that the magnetic structure of $Cr_{70}Al_{30}$ shows a ferromagnetic arrangement within the (200) face, and an antiferromagnetic arrangement within the (110) face, and thus if interfacial inequalities less occur, the antiferromagnetic arrangement is formed in the interface in a laminate structure comprising the $Cr_{70}Al_{30}$ film and the $Ni_{81}Fe_{19}$ film, and exchange coupling is canceled. However, if inequalities (steps or irregularities) of the atomic size are present in the interface, a portion with exchange coupling remaining uncanceled is present, thereby generating exchange coupling. Therefore, only in a structure comprising the $Cr_{70}Al_{30}$ film as a lower layer, exchange coupling can be obtained due to the inequalities (steps or irregularities) of the atomic size.

It is found from these results that the antiferromagnetic $Cr_{70}Al_{30}$ film is characterized in that a thick critical antiferromagnetic film thickness (300 Å) at which the exchange anisotropic magnetic field is manifested is larger than that (70 Å) of a known material film of Mn—Fe or the like. This indicates that antiferromagnetic domain wall energy gives exchange coupling energy. Therefore, the length corresponding to the thickness of the $Cr_{70}Al_{30}$ film at which the exchange anisotropic magnetic field is manifested can be considered as the critical length for forming antiferromagnetic domain walls. This can be applied to not only the direction of the thickness but also the plane direction. If the crystal grain size is smaller than this critical length, spins cannot revolve, and antiferromagnetic domain walls are formed only in the direction of the thickness in the one-dimensional manner.

Figure 14:
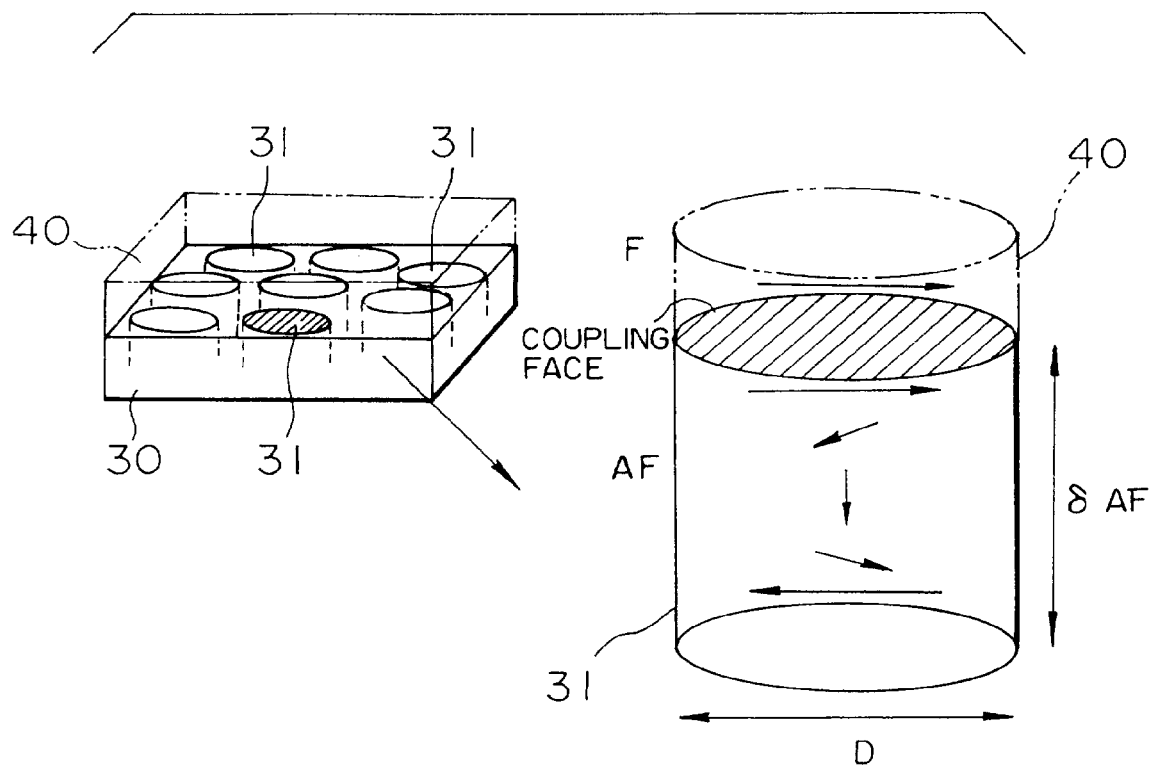
FIG. 14 is a drawing showing a model for the crystal grain size, the direction of magnetization and the width of a magnetic domain wall in an antiferromagnetic film in contact with a ferromagnetic film.

The above description will be schematically illustrated. In consideration of a structure in which crystal grains 31 are dispersed in an AMR ferromagnetic film 30, and an antiferromagnetic film 40 is laminated thereon, as shown in FIG. 14, when the grain size D of the AMR ferromagnetic film 30 is smaller than the thickness $\delta_{AF}$ of the AMR ferromagnetic film 30, i.e., when $D > \delta_{AF}$ correlation possibly occurs between the exchange anisotropic magnetic field and the crystal grains of the antiferromagnetic film.

Therefore, the crystal grain size of the $Cr_{70}Al_{30}$ film is preferably 300 Å or less, and more preferably 140 Å or less in order to easily obtain the exchange anisotropic magnetic field of 20 Oe or more, shown in FIG. 11.

Although, in the above examples, the crystal grain size is controlled by the thickness of the $Ni_{81}Fe_{19}$ film provided below the $Cr_{70}Al_{30}$ film, even when the base film of MgO, AlN, Ta, ZnO, Si or the like is provided, the crystal grain size of the antiferromagnetic film can, of course, be controlled by the thickness of the base film.

Figure 15:
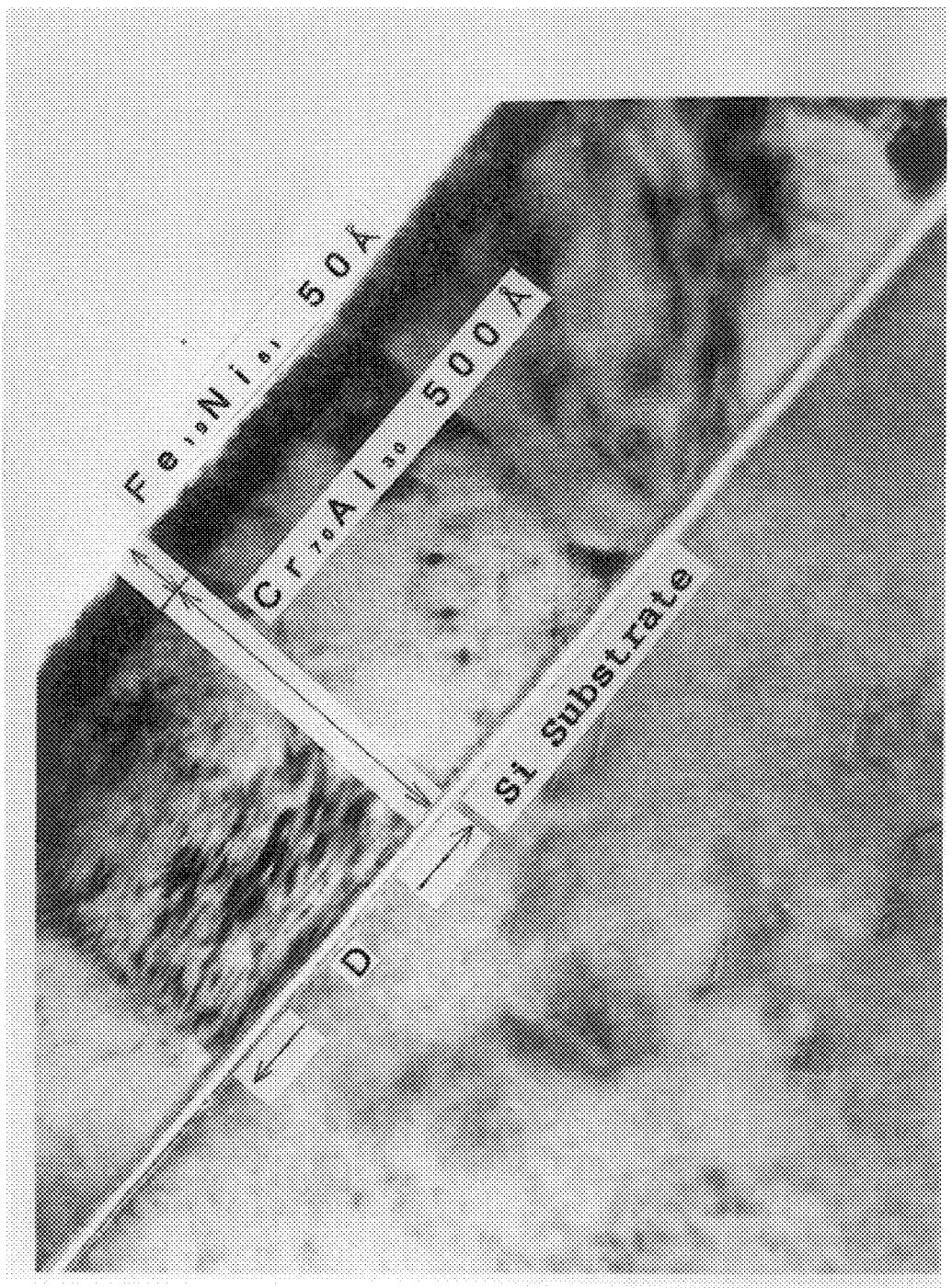
FIG. 15 is a TEM photograph showing a section of an exchange coupling thin film comprising a $Cr_{70}Al_{30}$ film and an $Ni_{81}Fe_{19}$ film which were laminated in turn on an Si substrate.

FIG. 15 is an electron microscope photograph of a section of a sample comprising a $Cr_{70}Al_{30}$ film (500 Å) and an $Ni_{81}Fe_{19}$ film (500 Å) which were laminated on an Si substrate. This sectional structure reveals that the crystal grain size D of the $Cr_{70}Al_{30}$ film is smaller than the thickness $\delta_{AF}$ thereof.

Figure 16:
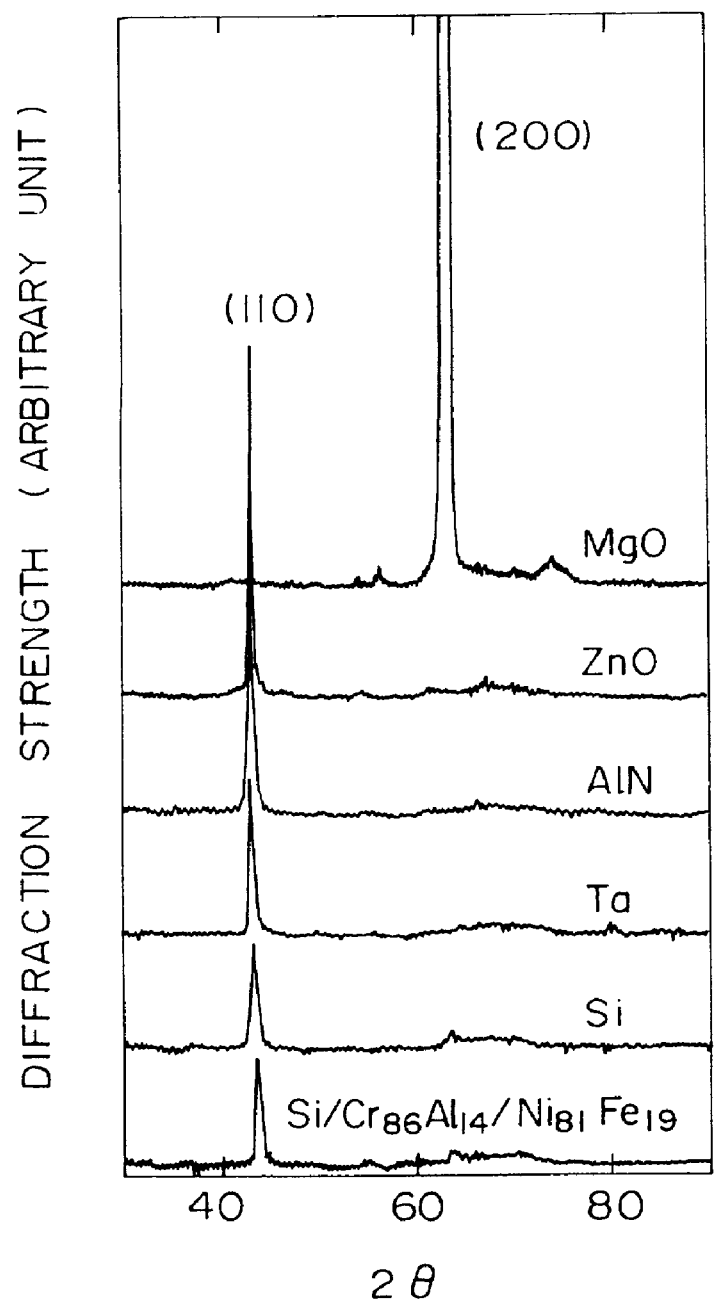
FIG. 16 is a diagram showing the X-ray diffraction patterns of samples each comprising a base film, a $Cr_{81}Al_{19}$ film and an $Ni_{81}Fe_{19}$ film which were laminated in turn on each of Si substrates while changing the material of the base film.

FIG. 16 shows the X-ray diffraction patterns of exchange coupling thin films each comprising a base film Si of 100 Å thick which was formed on each of a plurality of Si substrates by RF sputtering while changing the material to Ta, AlN, ZnO and MgO, and a $Cr_{86}Al_{14}$ film of 1000 Å thick and an $Ni_{81}Fe_{19}$ film of 50 Å which were formed on the base film by DC sputtering, and the same exchange coupling thin film except the base film.

The results shown in FIG. 16 indicate that regardless of the presence of the base film, strong peaks are observed at (110) and (200) in all structures, and thus these structures have {110} and {100} orientation.

Figure 17:
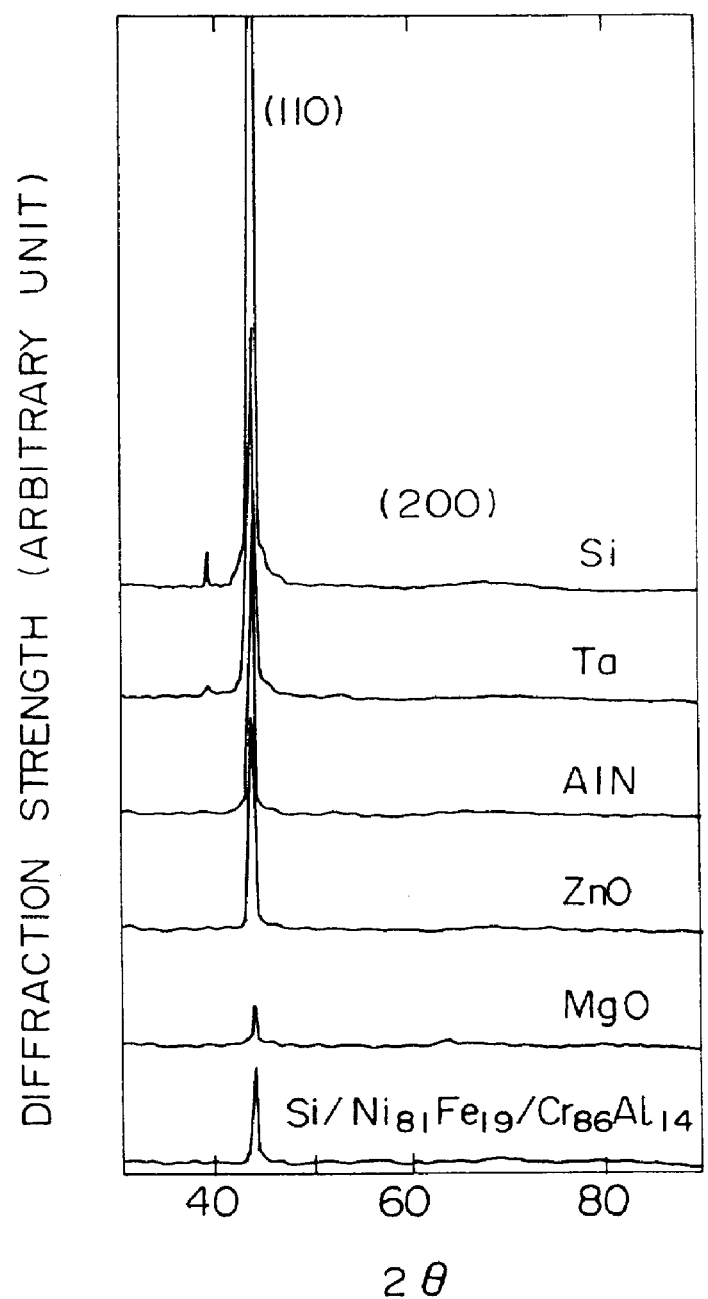
FIG. 17 is a diagram showing the X-ray diffraction patterns of samples each comprising a base film, an $Ni_{81}Fe_{19}$ film and a $Cr_{81}Al_{19}$ film which were laminated in turn on each of Si substrates while changing the material of the base film.

FIG. 17 shows the X-ray diffraction patterns of structures in which the lamination order of the $Cr_{86}Al_{14}$ film and the $Ni_{81}Fe_{19}$ film is opposite to that in the laminate structure shown in FIG. 16 (i.e., the $Cr_{86}Al_{14}$ film is formed on the $Ni_{81}Fe_{19}$ film).

The results shown in FIG. 17 indicate that regardless of the presence of the base film, a strong peak and a slight peak were observed at (110) and (200), respectively, in all structures, and thus these structures have {110} and {100} orientation.

Figure 18:
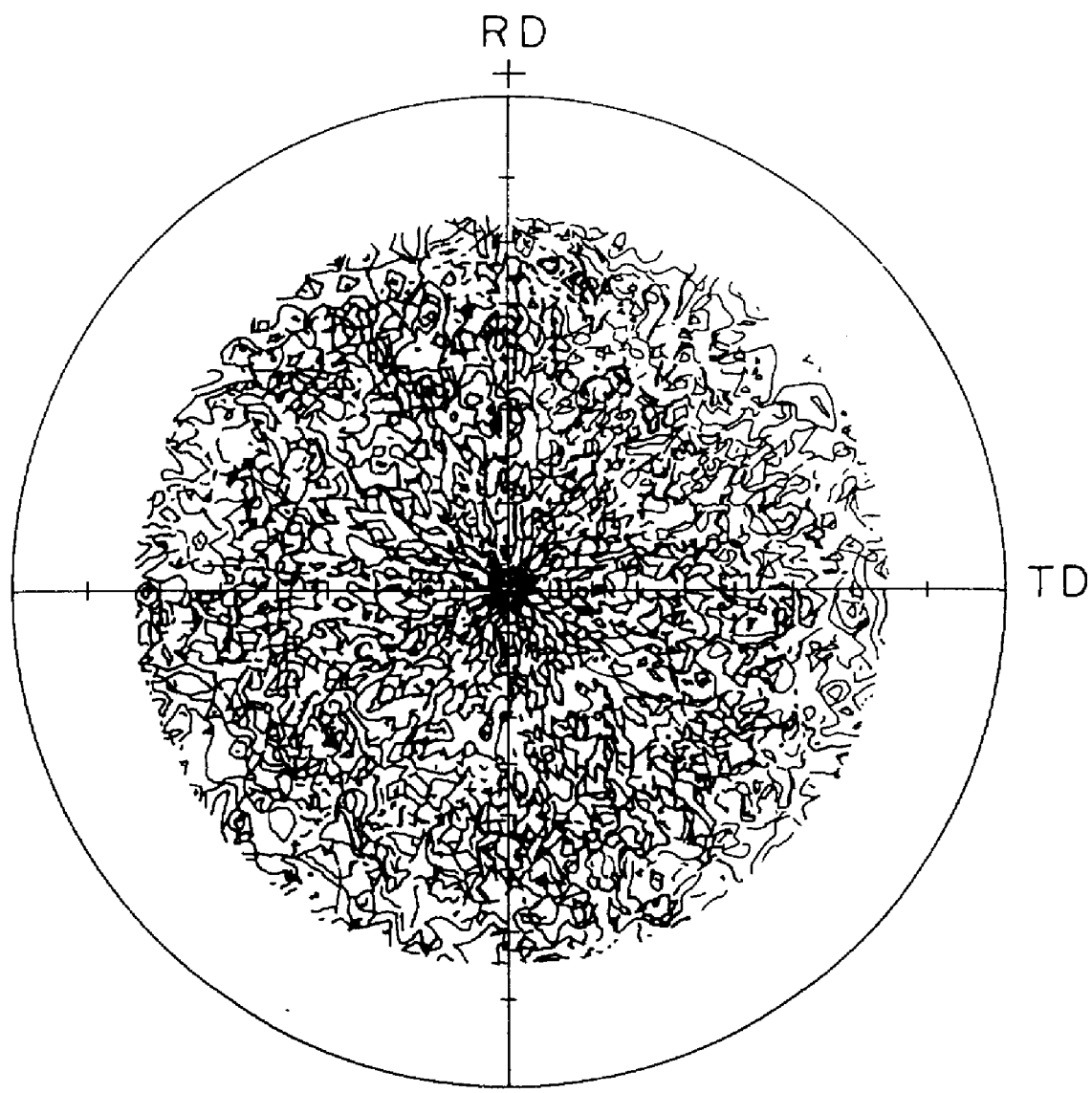
FIG. 18 is a pole figure of a sample comprising a ZnO base film, a $Cr_{81}Al_{19}$ film and an $Ni_{81}Fe_{19}$ film which were laminated in turn on an Si substrate.
Figure 19:
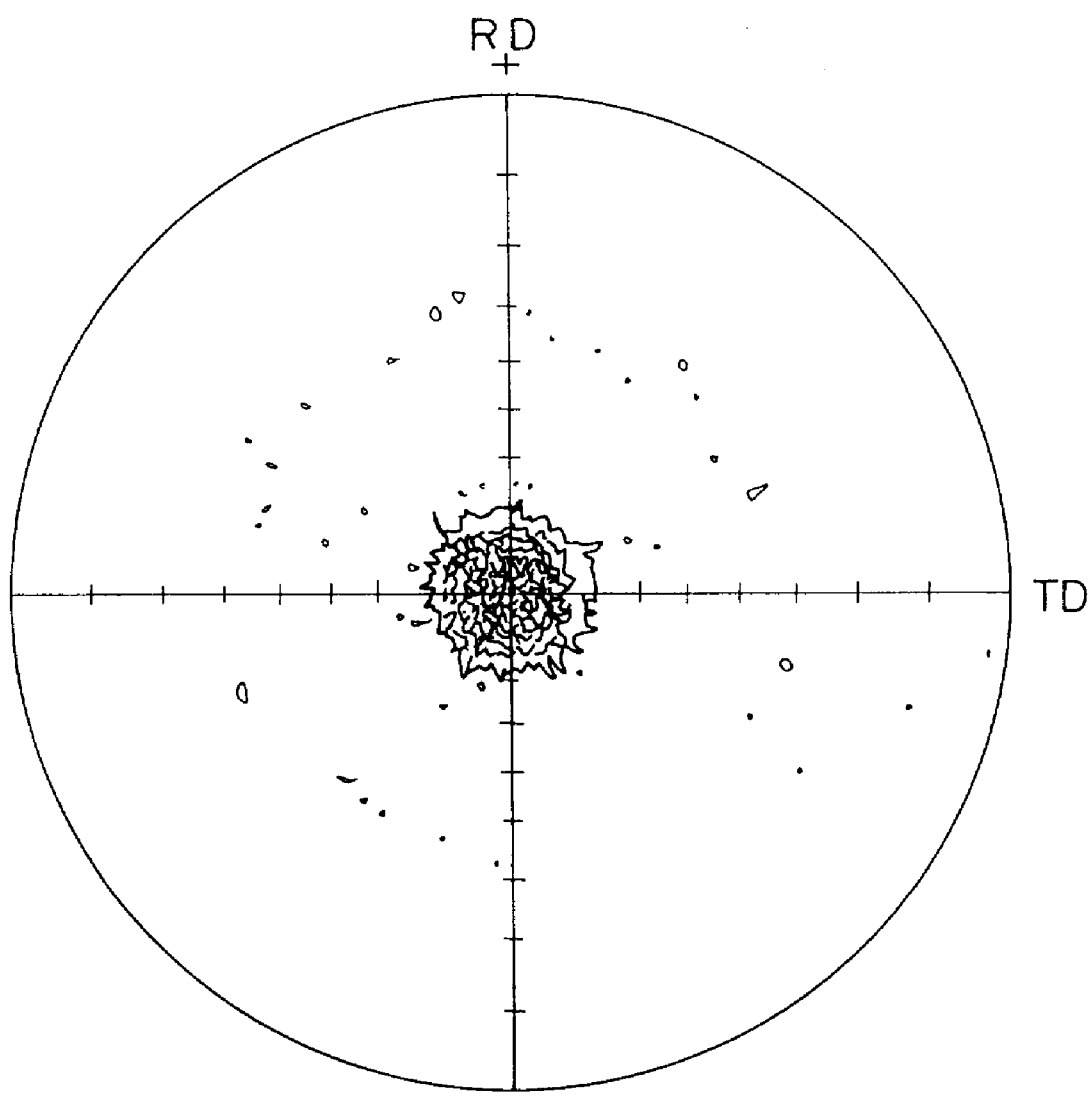
FIG. 19 is a pole figure of a sample comprising a Zno base film, an Ni81Fe$_{19}$ film and a Cr$_{81}$Al$_{19}$ film which were laminated in turn on an Si substrate.

FIG. 18 is a pole figure of an exchange coupling thin film comprising a ZnO base film of 100 Å thick formed on an Si substrate, and the same CrAl film and NiFe film as those shown in FIG. 16 which were laminated in turn on the base film. FIG. 19 is a pole figure of an exchange coupling thin film comprising a ZnO base film of 100 Å thick formed on an Si substrate, and the same CrAl film and NiFe film as those shown in FIG. 11 which were laminated in turn on the base film.

FIGS. 18 and 19 reveal that, with the ZnO base film, when NiFe is formed on CrAl, orientation is poor, and when CrAl is formed on NiFe, orientation is good. Such a tendency is true of the samples wherein each of AlN and Ta is used for the base film.

Figure 20:
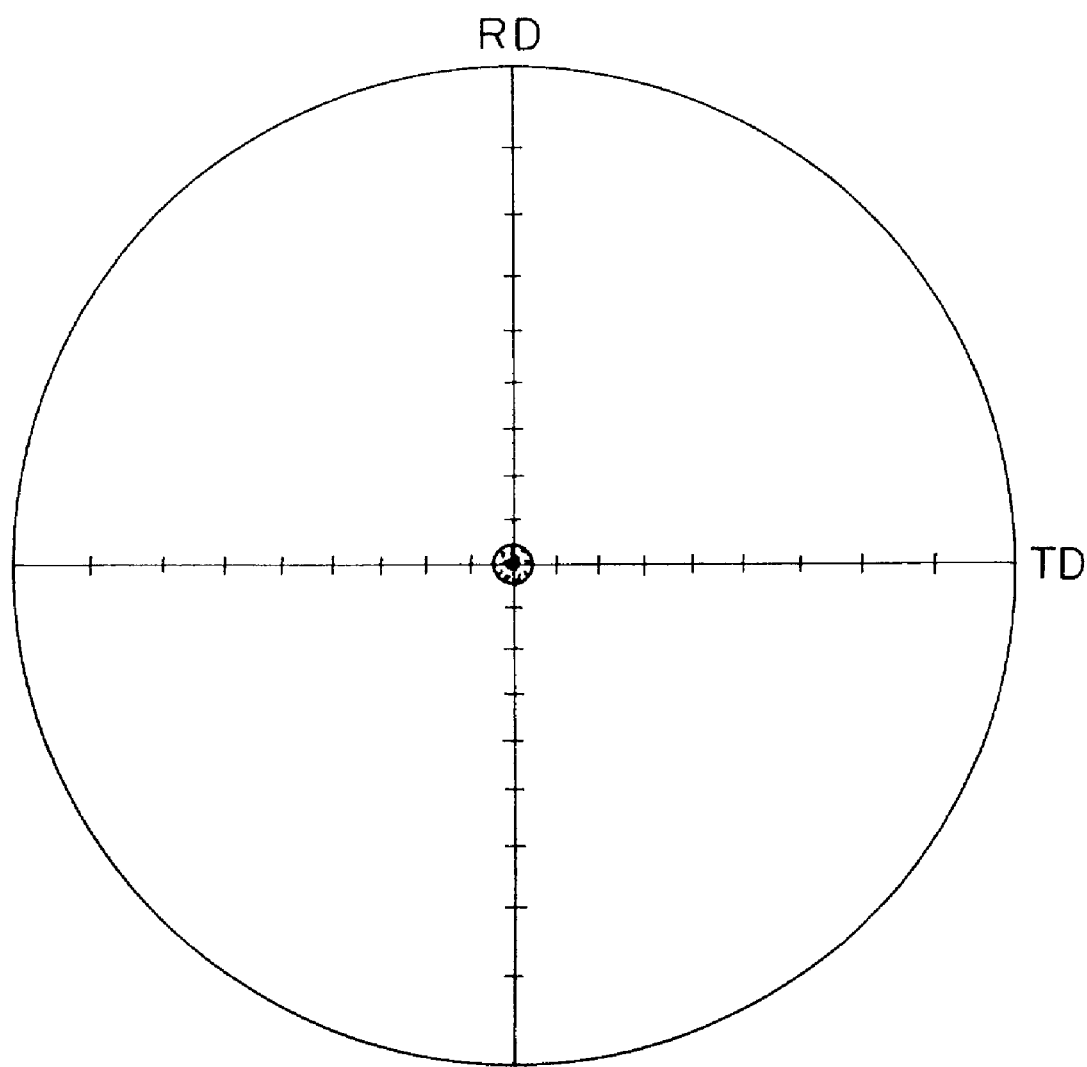
FIG. 20 is a pole figure of a sample comprising a MgO base film, a Cr$_{81}$Al$_{19}$ film and an Ni$_{81}$Fe$_{19}$ film which are laminated in turn on an Si substrate.
Figure 21:
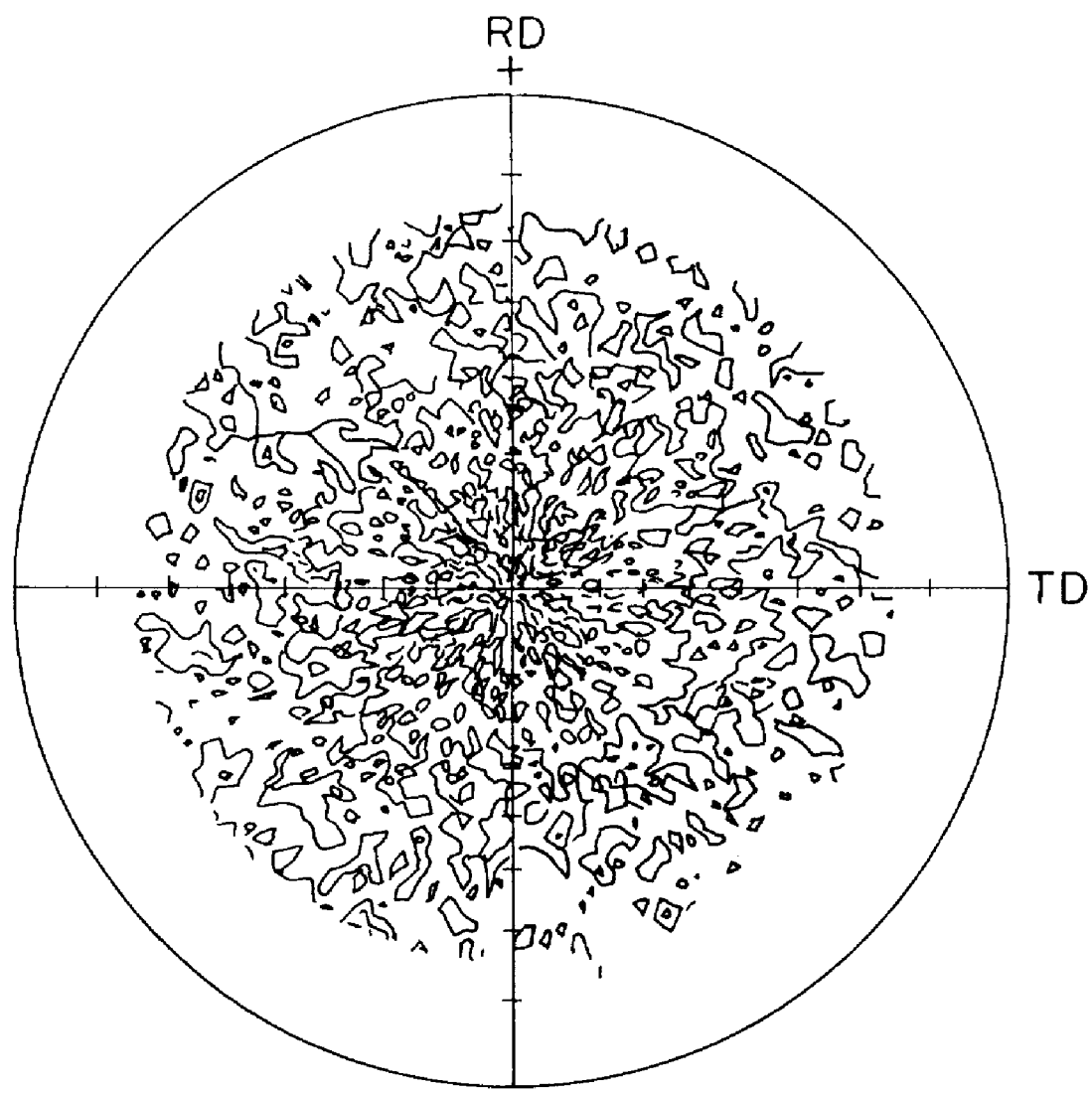
FIG. 21 is a pole figure of a sample comprising a MgO base film, an Ni$_{81}$Fe$_{19}$ film and a Cr$_{81}$Al$_{19}$ film which were laminated in turn on an Si substrate.

FIG. 20 is a pole figure of an exchange coupling thin film comprising a MgO base film of 100 Å thick formed on an Si substrate, and the same CrAl film and NiFe film as those shown in FIG. 10 which were laminated in turn on the base film. FIG. 21 is a pole figure of an exchange coupling thin film comprising a MgO base film of 100 Å thick formed on an Si substrate, and the same CrAl film and NiFe film as those shown in FIG. 11 which were laminated in turn on the base film.

FIGS. 18 and 19 reveal that, with the MgO base film, when NiFe is formed on CrAl, orientation is good, and when CrAl is formed on NiFe, orientation is poor.

The results shown in FIGS. 18 to 21 indicate that with the base film of each of ZnO, AlN and Ta, the structure in which the CrAl film is formed on the NiFe film has good orientation, and that, with the base film of MgO, the structure in which the CrAl film is formed below the NiFe film has good orientation. It is thus found that the positional relation between the CrAl film and the NiFe film, and the type of the base film formed delicately affect orientation.

The results of measurement of resistivity of CrAl samples of the present invention are shown in Table 1. The resistivity was measured by a four-terminal method with I=200 mA.

TABLE 1

| Cr (at %) | Al (at %) | p($\mu\Omega$cm) |
| --- | --- | --- |
| 68.1 | 31.9 | 1334.0 |
| 70.2 | 29.8 | 1470.6 |
| 71.8 | 28.2 | 1274.9 |

The results shown in Table 1 indicate that the CrAl antiferromagnetic films having any composition have high resistivity of 1274 to 1334 $\mu\Omega$cm. Therefore, the use of the antiferromagnetic film of the present invention for the AMR head and spin-valve head shown in FIGS. 1 to 4 can decrease the current flowing through the antiferromagnetic film, improve the output of a head and suppress the Barkhausen noise.

What is claimed is:

1. An exchange coupling thin film comprising an antiferromagnetic film mainly comprising a crystal phase of a body-centered cubic structure and consisting of Cr and element M where the element M contains at least one element of the 3b group elements in the Periodic Table, or Al, Ga or In, and a ferromagnetic film containing at least one of Fe, Ni, and Co, both of the antiferromagnetic and ferromagnetic films being laminated in contact with each other, wherein magnetic exchange coupling is generated in the interface between the antiferromagnetic film and the ferromagnetic film, wherein the antiferromagnetic film is oriented with preference to either {100} or {110} and the exchange anisotropic magnetic field is 30 Oe or more.

2. An exchange coupling thin film according to claim 1 wherein the antiferromagnetic film and the ferromagnetic film are formed on a substrate through a base film wherein the base film consists of at least one of MgO, AlN, Ta, ZnO, Si and Fe—Ni alloys.

3. An exchange coupling thin film comprising an antiferromagnetic film mainly comprising a crystal phase of a body-centered cubic structure and consisting of Cr and element M where the element M contains at least one element of the 3b group elements in the Periodic Table, or Al, Ga or In, and a ferromagnetic film containing at least one of Fe, Ni, and Co, both of the antiferromagnetic and ferromagnetic films being laminated in contact with each other, wherein magnetic exchange coupling is generated in the interface between the antiferromagnetic film and the ferromagnetic film, wherein the antiferromagnetic film is oriented with preference to either {100} or {110} and the thickness of the antiferromagnetic film is about 400 to about 900 Å.

4. An exchange coupling thin film comprising an antiferromagnetic film mainly comprising a crystal phase of a body-centered cubic structure and consisting of Cr and element M where the element M contains at least one element of the 3b group elements in the Periodic Table, or Al, Ga or In, and a ferromagnetic film containing at least one of Fe, Ni, and Co, both of the antiferromagnetic and ferromagnetic films being laminated in contact with each other, wherein magnetic exchange coupling is generated in the interface between the antiferromagnetic film and the ferromagnetic film, wherein the thickness of the antiferromagnetic film is about 400 to about 900 Å.

5. The exchange coupling thin film according to claim 4, wherein the natural corrosion potential of the antiferromagnetic film is a positive value relative to a saturated calomel electrode.

6. The exchange coupling thin film according to claim 4, wherein the resistivity of the antiferromagnetic film is 500 $\mu\Omega$cm or more.

7. The exchange coupling thin film according to claim 4, wherein the crystal grain size D of the antiferromagnetic film is smaller than the magnetic domain wall width $\delta_{AF}$ thereof.

8. The exchange coupling thin film according to claim 4, wherein the crystal grain size D of the antiferromagnetic film satisfies the relation D≦300 Å.

9. The exchange coupling thin film according to claim 4, wherein the antiferromagnetic film is represented by the following formula:

Wherein the composition ratios x and y are by atomic % and within the ranges of 60≦x≦95 and 5≦y≦40, respectively.

10. The exchange coupling thin film according to claim 4, wherein the ratios x and y are within the ranges of 65≦x≦80 and 20≦y≦35, respectively.

11. A magnetoresistive element comprising an exchange coupling thin film comprising an antiferromagnetic film having a body-centered cubic structure and consisting of Cr and element M where the element M contains at least one element of the 3b group elements in the Periodic Table, or Al, Ga or In, and a ferromagnetic film containing at least one of Fe, Ni, and Co, both of the antiferromagnetic and ferromagnetic films being laminated in contact with each other, and an exchange anisotropic magnetic field being generated in the interface between the antiferromagnetic film and the ferromagnetic film; and a soft magnetic material film laminated through at least a non-magnetic film to apply a lateral bias to the ferromagnetic film; wherein the exchange anisotropic magnetic field is 30 Oe or more.

12. A magnetoresistive element comprising an exchange coupling thin film comprising an antiferromagnetic film mainly comprising crystal phase having a body-centered cubic structure and consisting of Cr and element M where the element M contains at least one element of the 3b group elements in the Periodic Table, or Al, Ga or In, and a ferromagnetic film containing at least one of Fe, Ni and Co, both of the antiferromagnetic and ferromagnetic films being laminated in contact with each other, and magnetic exchange coupling being generated in the interface between the antiferromagnetic film and the ferromagnetic film to render the ferromagnetic film a pinned magnetic film; the ferromagnetic film laminated through at least a non-magnetic film and having a single magnetic domain formed therein; and the thickness of the antiferromagnetic film being about 400 to about 900 Å.

13. A magnetic head comprising a magnetoresistive element for reading magnetic data from a magnetic recording medium, comprising an exchange coupling thin film comprising an antiferromagnetic film mainly comprising a crystal phase of a body-centered cubic structure consisting of Cr and element M where the element M contains at least one element of the 3b group elements in the Periodic Table, or Al, Ga or In, and a ferromagnetic film containing at least one of Fe, Ni and Co, both of the antiferromagnetic and ferromagnetic films being laminated in contact with each other, and an exchange anisotropic magnetic field being generated in the interface between the antiferromagnetic film and the ferromagnetic film to apply a longitudinal bias to the ferromagnetic film; and a soft magnetic film laminated through at least a non-magnetic film to apply a lateral bias to the ferromagnetic film; wherein the exchange anisotropic magnetic field is 30 Oe or more; and an inductive head for writing magnetic data in the magnetic recording medium, comprising a magnetic core, a magnetic gap and a coil, the magnetic core consisting of a soft magnetic material for forming at least a magnetic circuit.

14. A magnetic head comprising a magnetoresistive element for reading magnetic data from a magnetic recording medium, comprising an exchange coupling thin film comprising an antiferromagnetic film mainly comprising an antiferromagnetic film mainly comprising a crystal phase of a body-centered cubic structure and consisting of Cr and element M where the element M contains at least one element of the 3b group elements in the Periodic Table, or Al, Ga or In, and a ferromagnetic film containing at least one of Fe, Ni and Co, both of the antiferromagnetic and ferromagnetic films being laminated in contact with each other, and magnetic exchange coupling being generated in the interface between the antiferromagnetic film and the ferromagnetic film to render a pinned magnetic film; the ferromagnetic film laminated through at least a non-magnetic film and having a single magnetic domain formed therein; the thickness of the antiferromagnetic film being about 400 to about 900 Å; and an inductive head for writing magnetic data in the magnetic recording medium, comprising a magnetic core, a magnetic gap and a coil, the magnetic core consisting of a soft magnetic material for forming at least a magnetic circuit.

* * * * *